(12) United States Patent
Iino et al.

(10) Patent No.: US 7,608,502 B2
(45) Date of Patent: Oct. 27, 2009

(54) METHOD FOR MANUFACTURING SEMICONDUCTOR DEVICE

(75) Inventors: Tomohisa Iino, Kanagawa (JP); Naomi Fukumaki, Kanagawa (JP); Yoshitake Kato, Kanagawa (JP); Tomoe Yamamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 874 days.

(21) Appl. No.: 11/206,777

(22) Filed: Aug. 19, 2005

(65) Prior Publication Data

US 2006/0046421 A1    Mar. 2, 2006

(30) Foreign Application Priority Data

Aug. 24, 2004    (JP)    ............... 2004-243284

(51) Int. Cl.
*H01L 21/8242* (2006.01)
(52) U.S. Cl. .................. 438/240; 438/238; 438/381; 257/E21.17; 257/E21.267; 257/E21.324; 257/E21.646; 257/E21.649
(58) Field of Classification Search .......... 438/240, 438/238, 381, 513, 680, 681, 683, 685, 725, 438/769, 770
See application file for complete search history.

(56) References Cited

U.S. PATENT DOCUMENTS

| | | | |
|---|---|---|---|
| 6,238,964 B1 * | 5/2001 | Cho ............. | 438/240 |
| 6,339,007 B1 * | 1/2002 | Wang et al. .......... | 438/393 |
| 6,355,516 B1 * | 3/2002 | Kim et al. ........... | 438/240 |
| 6,509,593 B2 * | 1/2003 | Inoue et al. .......... | 257/295 |
| 6,913,970 B2 * | 7/2005 | Inoue et al. .......... | 438/253 |
| 6,982,205 B2 * | 1/2006 | Joo et al. ........... | 438/393 |
| 7,297,591 B2 * | 11/2007 | Won et al. ........... | 438/253 |

FOREIGN PATENT DOCUMENTS

JP    2003-243526 A    8/2003

* cited by examiner

*Primary Examiner*—David Nhu
(74) *Attorney, Agent, or Firm*—Sughrue Mion, PLLC

(57) ABSTRACT

In the process for manufacturing a semiconductor device of the present invention, a capacitor dielectric film is deposited via an atomic layer deposition employing an organic source material containing one or more metallic element(s) selected from the group consisting of Zr, Hf, La and Y as a deposition gas. The process for manufacturing a capacitor of the present invention includes obtaining a boundary temperature T (degree C.), at which an increase in a deposition rate for depositing the capacitor dielectric film as increasing the temperature is detected, on the basis of a correlation data of a deposition temperature in the atomic layer deposition employing the deposition gas with a deposition rate for depositing the capacitor dielectric film at the deposition temperature (S100 and S102); and depositing the capacitor dielectric film via the atomic layer deposition employing the deposition gas at a temperature within a range of from (T−20) (degree C.) to (T+20) (degree C.) (S104 to S112).

10 Claims, 10 Drawing Sheets

| | DEPOSITION TEMPERATURE (°C) | LEAKAGE CURRENT(A/cell) |
|---|---|---|
| EXAMPLE 1 | 250 (BOUNDARY TEMPERATURE) | $1 \times 10^{-16}$ |
| | 270 | $5 \times 10^{-16}$ |

METHOD FOR MANUFACTURING SEMICONDUCTOR DEVICE

This application is based on Japanese patent application NO. 2004-243284, the content of which is incorporated hereinto by reference.

BACKGROUND OF THE INVENTION

1. Field of the Invention

The present invention relates to a method for manufacturing a semiconductor device including a capacitor, and in particular, relates to a method for manufacturing a semiconductor device that utilize depositing a capacitor dielectric film of the capacitor by an atomic layer deposition.

2. Related Art

Increasing achievements in miniaturization/integration of dynamic random access memory (DRAM) in recent years leads to promote a requirement for acquiring sufficient capacitance for a cell capacitance as one of critical issues. One of exemplary technique for acquiring sufficient capacitance may be a method of increasing a relative dielectric constant of a capacitor dielectric film.

In Laid-Open Japanese Patent Application No. 2003-243, 526, a capacitor including a capacitor dielectric film (oxide layer), which is configured by depositing a high dielectric constant material such as $ZrO_2$ or $Ta_2O_5$ via an atomic layer deposition (hereinafter referred to as ALD), is disclosed. When a capacitor dielectric film is formed via ALD in a conventional technology, a deposition of a material is conducted at a temperature of on the order of about 300 degree C. to 400 degree C.

SUMMARY OF THE INVENTION

However, as a result of investigations by the present inventors, it has been found that it is difficult to manufacture a capacitor having longer durability and higher reliability without an appropriate temperature control depending on the type of material, when a capacitor dielectric film is formed via ALD.

According to the present invention, there is provided a method for manufacturing a semiconductor device including a capacitor by depositing a capacitor dielectric film of the capacitor via an atomic layer deposition employing an organic source material containing one or more metallic element(s) selected from the group consisting of Zr, Hf, La and Y as a deposition gas, comprising: obtaining a boundary temperature T (degree C., centigrade), at which an increase in a deposition rate for depositing the capacitor dielectric film as increasing the temperature is detected, on the basis of a correlation data of a deposition temperature in the atomic layer deposition employing the deposition gas with a deposition rate for depositing the capacitor dielectric film at the deposition temperature; and depositing the capacitor dielectric film via the atomic layer deposition employing the deposition gas at a temperature within a range of from (T−20) (degree C.) to (T+20) (degree C.).

Here, the capacitor dielectric film may be composed of a high dielectric constant film containing one or more metallic element(s) selected from the group consisting of Zr, Hf, La and Y. The capacitor dielectric film may be formed of, for example, $ZrO_2$, $HfO_2$, $La_2O_3$, $Y_2O_3$ or the like.

As described later in the description of examples of the present invention, it has been clarified by the investigations of the present inventors that the reliability of the capacitor dielectric film can be enhanced by depositing the capacitor dielectric film via an atomic layer deposition within a certain temperature range centered on the above-described boundary temperature T (degree C.). Having such configuration, the reliability of the device employing such capacitor dielectric film can be enhanced.

According to the present invention, there is provided a method for manufacturing a semiconductor device including a capacitor by depositing a capacitor dielectric film of the capacitor via an atomic layer deposition employing an organic source material containing one or more metallic element(s) selected from the group consisting of Zr, Hf, La and Y as a deposition gas, comprising: obtaining a boundary temperature T (degree C.), at which an increase in a film thickness of the capacitor dielectric film formed in every cycle of the atomic layer deposition as increasing the temperature is detected, on the basis of a correlation data of a deposition temperature in the atomic layer deposition employing the deposition gas with a film thickness of the capacitor dielectric film formed in every cycle of the atomic layer deposition at the deposition temperature; and depositing the capacitor dielectric film via the atomic layer deposition employing the deposition gas at a temperature within a range of from (T−20) (degree C.) to (T+20) (degree C.).

Here, the film thickness of the capacitor dielectric film formed in every cycle may also be replaced with an average film thickness obtained by conducting the processes of multiple cycles.

In the method of present invention, the organic source material may contain C and N.

In the method of present invention, the organic material may contain a material presented by a general formula: $M(NRR')_4$ (where R and R' are $C_xH_y$, and M is a metallic element selected from the group consisting of Zr, Hf, La and Y).

In the method of present invention, the capacitor may contain a lower electrode composed of a metallic material, and in the depositing the capacitor dielectric film, the capacitor dielectric film may be formed on the lower electrode. In the present invention, the capacitor may be composed of a metal-insulator-metal (MIM) structure.

In the method of present invention, the depositing the capacitor dielectric film may include depositing the capacitor dielectric film by repeating a combination of introducing the deposition gas and introducing an oxidizing gas. Here, $O_3$ may be employed for the oxidizing gas.

According to the present invention, the reliability of a semiconductor including a capacitor containing a capacitor dielectric film deposited by the atomic layer deposition can be enhanced.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENT

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be presented.

Figure 1:
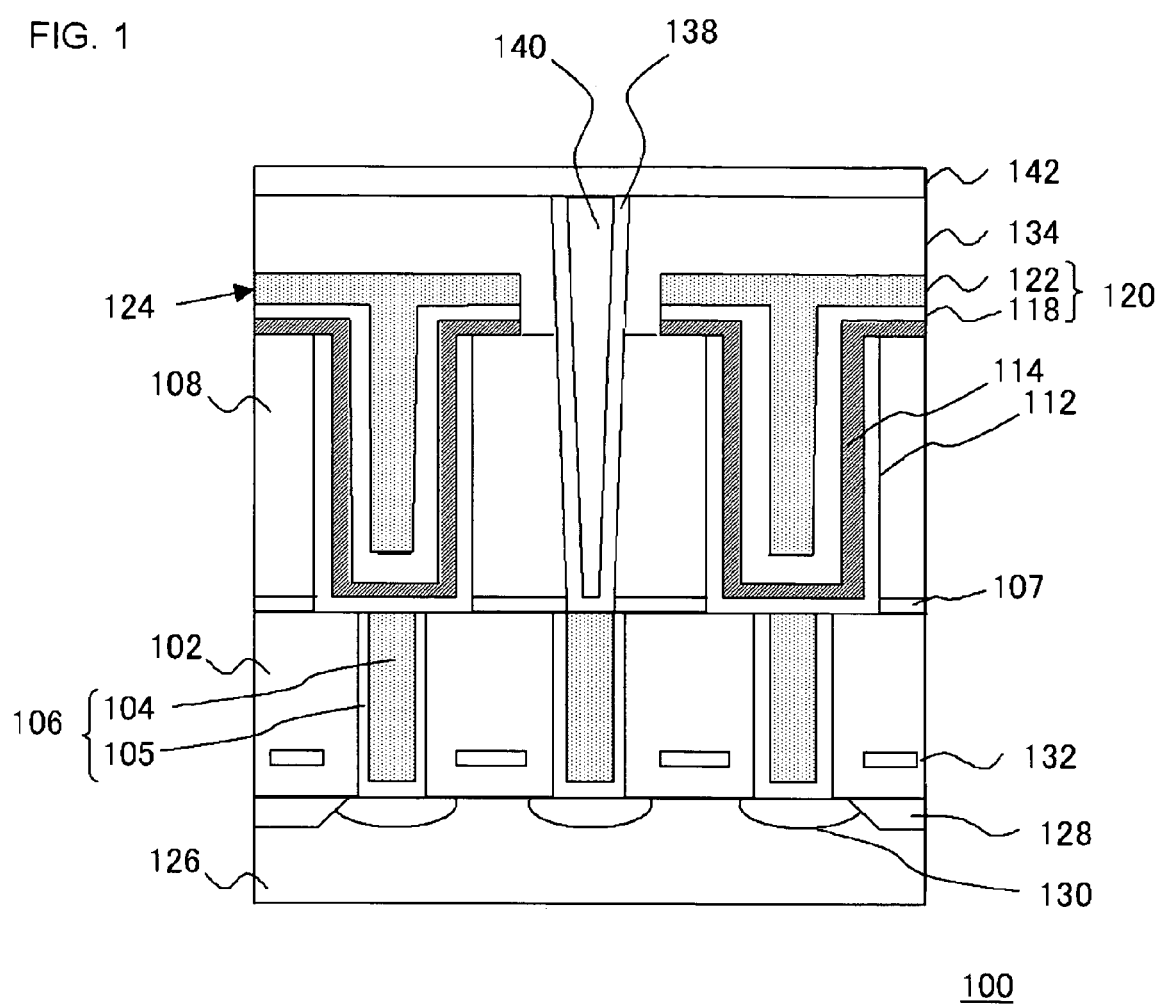
FIG. 1 a cross-sectional view, showing an exemplary configuration of a semiconductor device in an embodiment.

FIG. 1 is a cross-sectional view, showing a configuration of a semiconductor device including a capacitor in the present embodiment. Although a cylindrical shaped capacitor is illustrated here, it is not intended to limit the scope of the present invention thereto.

The semiconductor device 100 includes a semiconductor substrate 126 having sources and drains 130 and element separating regions 128 formed therein, gates 132 formed above the semiconductor substrate 126, a first insulating film 102 and plugs 106, an etching blocking film 107 formed on the first insulating film 102, a second insulating film 108 formed on the etching blocking film 107, capacitors 124 provided on the second insulating film 108, an interlayer insulating film 134 formed on the capacitors 124, an interconnect layer 142 formed on the interlayer insulating film 134, and barrier metal films 138 and metallic films 140 formed between the capacitors 124. The capacitor 124 includes a lower electrode 112, a capacitor dielectric film 114 and an upper electrode 120.

The Plug 106 is composed of a metallic film 104 and a barrier metal film 105. Here, the first insulating film 102 is composed of, for example, $SiO_2$. The metallic film 104 is composed of, for example, W. The barrier metal film 105 is composed of, for example, Ti, TiN, Ta or TaN. The etching blocking film 107 may be composed of SiON, for example, and is utilized as an etch stop film.

The second insulating film 108 is composed of, for example, $SiO_2$. In the present embodiment, the lower electrode 112 is composed of a metallic material. The Lower electrode 112 may be composed of, for example, TiN, TaN or WN.

The capacitor dielectric film 114 may be composed of a high dielectric constant film. In the present embodiment, the capacitor dielectric film 114 may be composed of an oxide or oxides of one or more metallic element(s) selected from the group consisting of, for example, Zr, Hf, La and Y.

The upper electrode 120 is composed of a first upper electrode film 118 and a second upper electrode film 122. The first upper electrode film 118 may be composed of, for example, TiN, TaN or WN. The second upper electrode film 122 may be composed of, for example, W.

FIGS. 2A to 2E, FIGS. 3F and 3G, FIGS. 11A and 11B, FIGS. 12C and 12D and FIGS. 13E and 13F are cross-sectional views, illustrating an exemplary procedure for manufacturing the semiconductor device 100 having the configuration shown in FIG. 1.

Figure 2A:
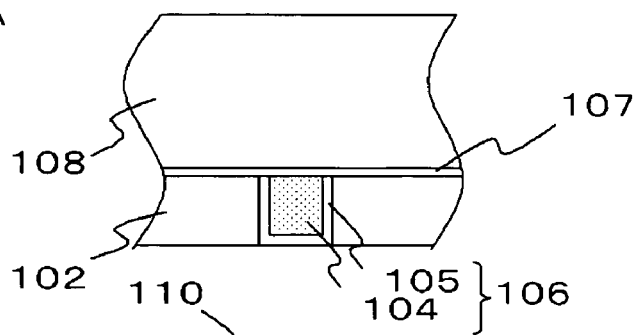
FIGS. 2A to 2E are cross-sectional views, illustrating an exemplary procedure for manufacturing the semiconductor device in the embodiment.

First, the first insulating film 102 is formed on the semiconductor substrate (not shown in FIGS. 2A to 2E and FIGS. 3F and 3G), and the plug 106 is formed on the first insulating film 102. Then, the etching blocking film 107 is formed on the first insulating film 102, and the second insulating film 108 is formed thereon (FIG. 2A).

Figure 2B:
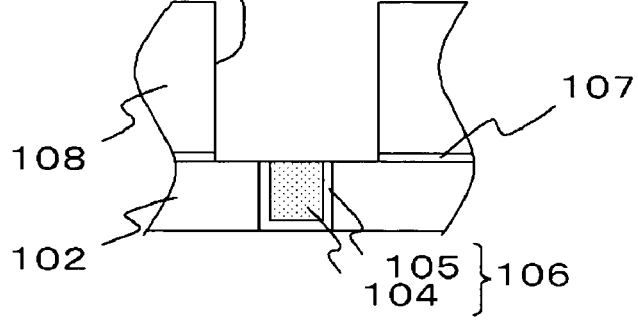
Figure 2C:
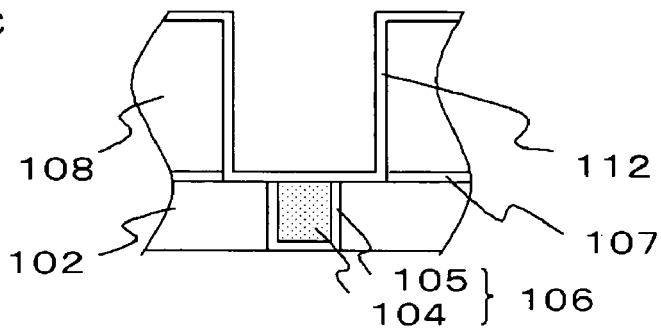

Subsequently, the second insulating film 108 and the etching blocking film 107 are sequentially etched by a known lithographic technology to form a concave portion 110 in the second insulating film 108. The upper surface of the plug 106 is exposed by such process (FIG. 2B). Thereafter, the lower electrode 112 is formed on the entire surface of the second insulating film 108 (FIG. 2C). The lower electrode 112 may be formed via CVD process, for example.

Figure 2D:
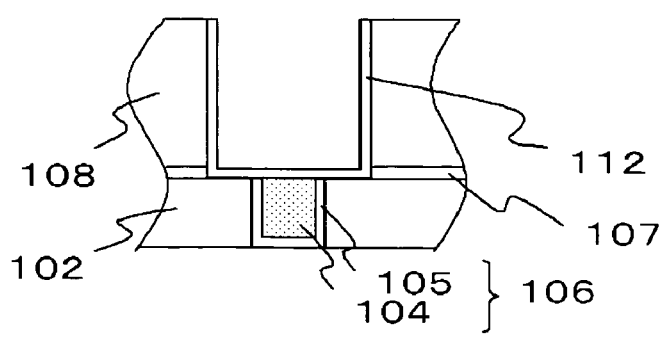

Subsequently, a sacrificial film (not shown) is formed to fill the concave portion 110 on the lower electrode 112 therewith. Then, the sacrificial film and the lower electrode 112 are etched to remove a portion of the lower electrode 112 that is exposed outside of the concave portion 110. Thereafter, the remaining sacrificial film in the concave portion 110 is removed via an etching (FIG. 2D).

Figure 2E:
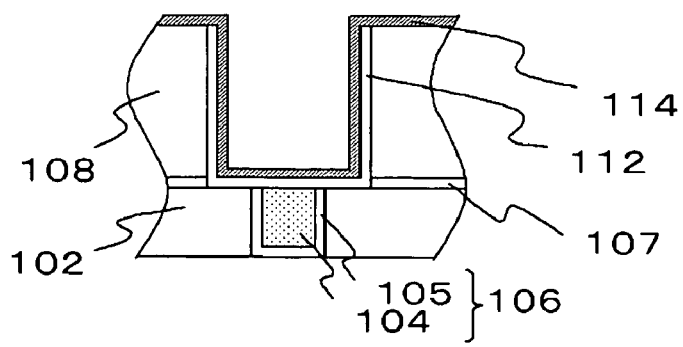

Subsequently, the capacitor dielectric film 114 is deposited on the second insulating film 108 and the lower electrode 112 (FIG. 2E). The capacitor dielectric film 114 maybe deposited via anatomic layer deposition (hereinafter referred to as ALD). Details of the process will be described later.

Figure 3F:
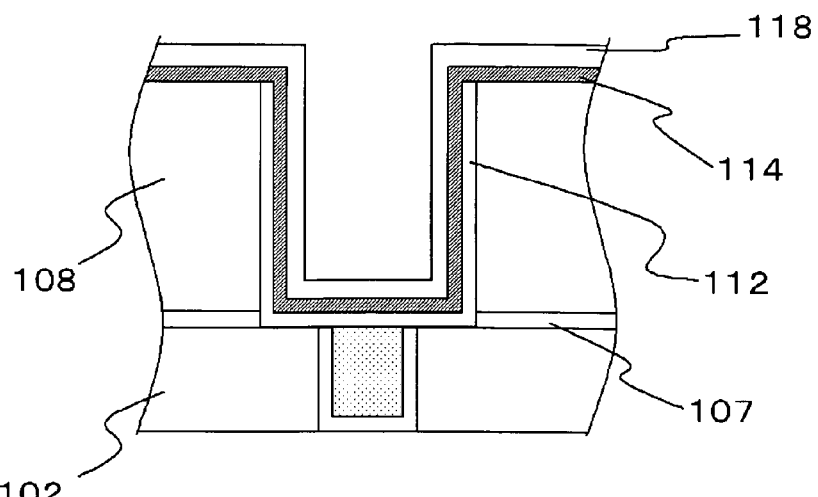
FIGS. 3F and 3G are cross-sectional views, illustrating an exemplary procedure for manufacturing the semiconductor device in the embodiment.

Thereafter, the first upper electrode film 118 is formed on the capacitor dielectric film 114 (FIG. 3F). The first upper electrode film 118 may be formed via, for example, CVD, ALD, physical vapor deposition (PVD) or a combination thereof.

Figure 3G:
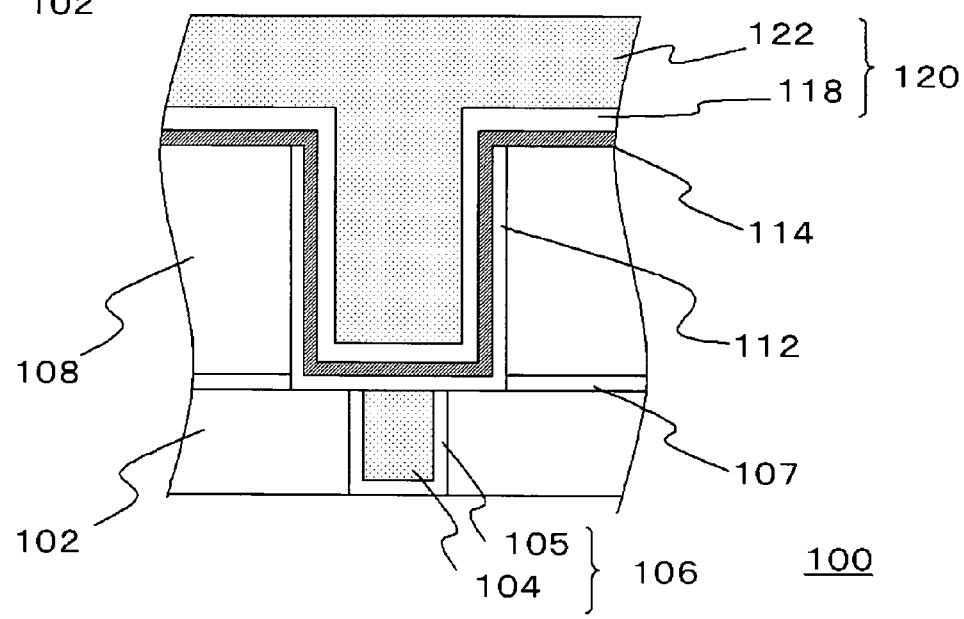

The second upper electrode film 122 is formed subsequently on the first upper electrode film 118 (FIG. 3G). The upper electrode 120 is formed by such process. An electric resistance of the upper electrode 120 can be maintained to be lower by providing such type of the second upper electrode film 122.

The capacitor 124 is formed by the above described processing.

Figure 11A:
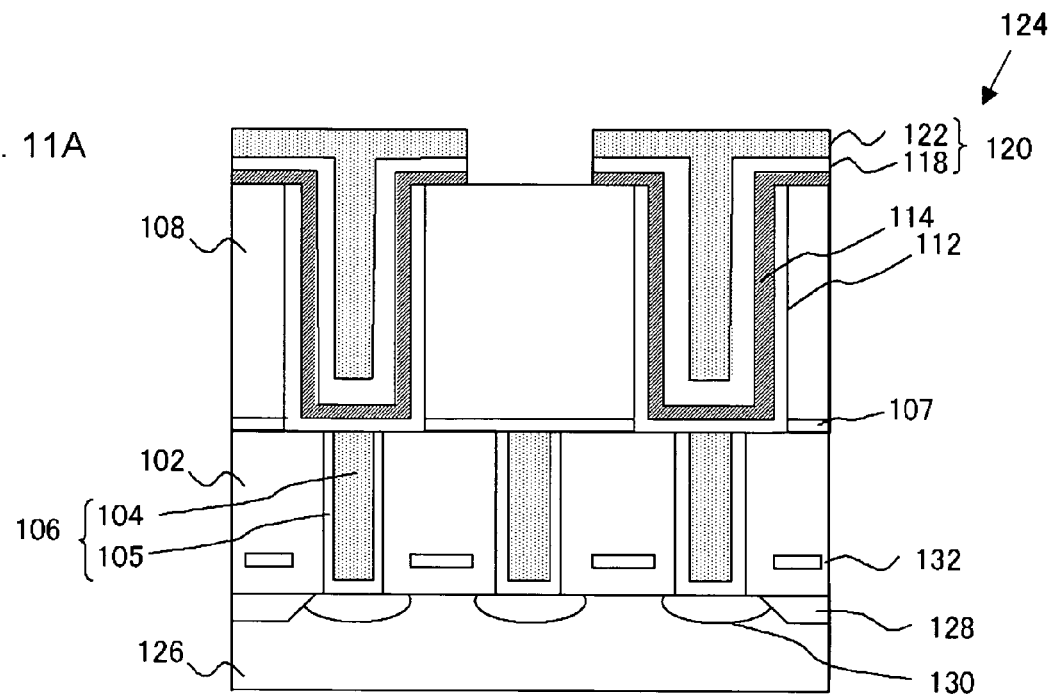
FIGS. 11A and 11B are cross-sectional views, illustrating an exemplary procedure for manufacturing the semiconductor device in the embodiment.
Figure 11B:
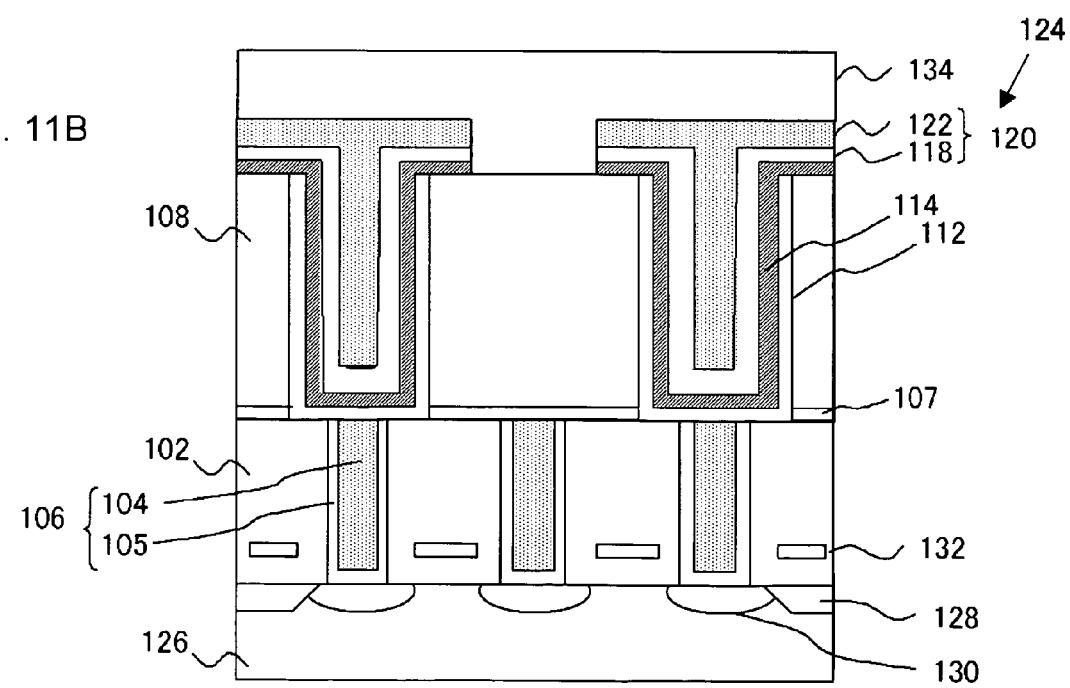
Figure 12C:
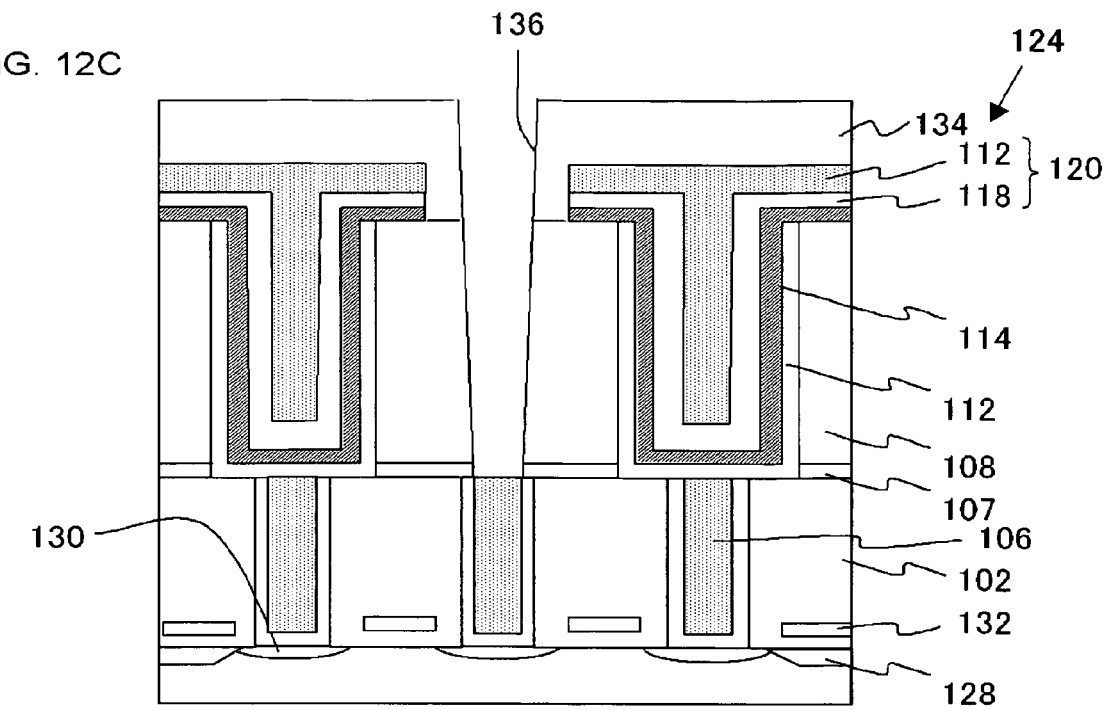
FIGS. 12C and 12D are cross-sectional views, illustrating an exemplary procedure for manufacturing the semiconductor device in the embodiment.
Figure 12D:
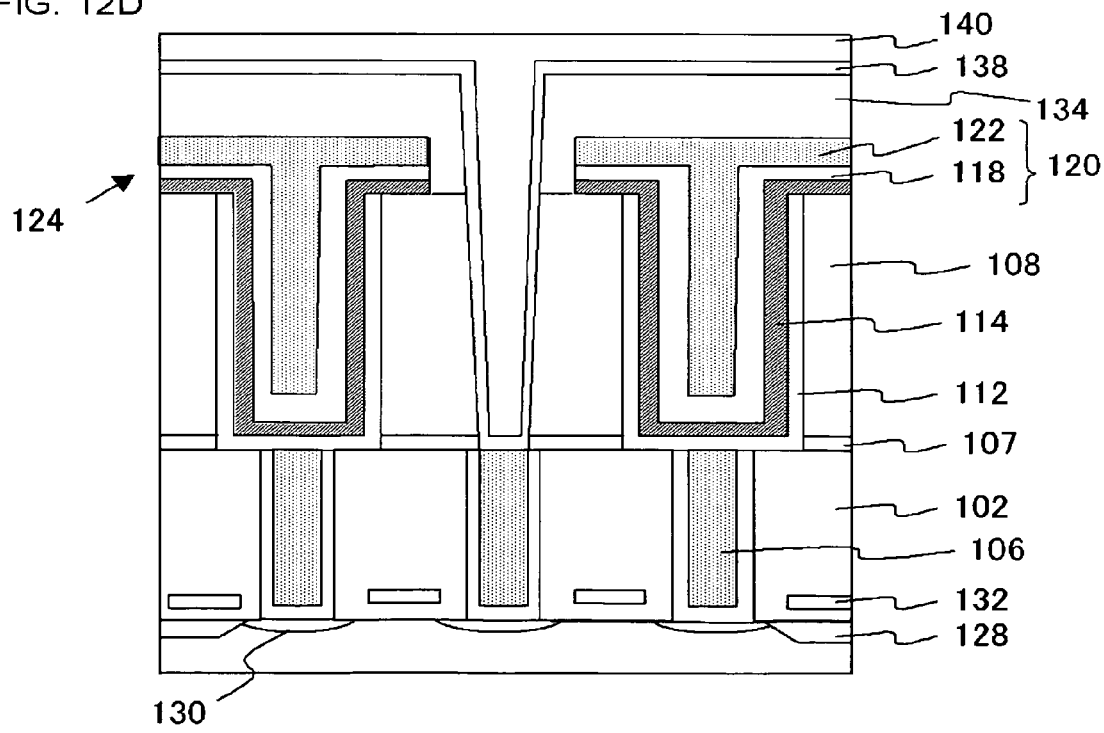
Figure 13E:
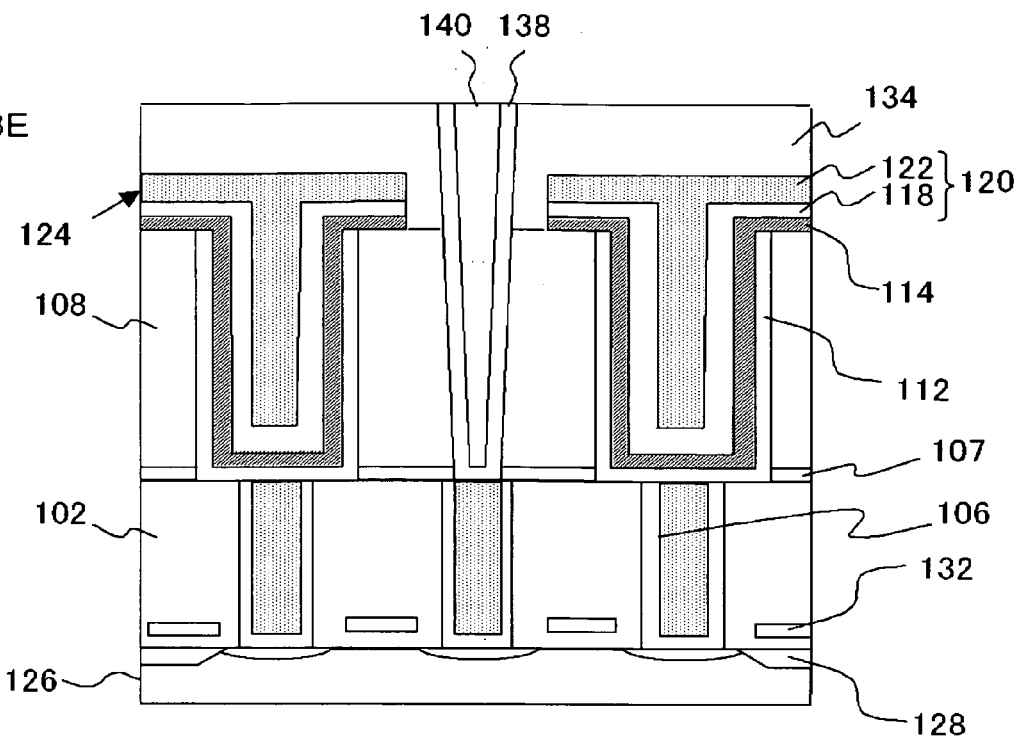
FIGS. 13E and 13F are cross-sectional views, illustrating an exemplary procedure for manufacturing the semiconductor device in the embodiment.
Figure 13F:
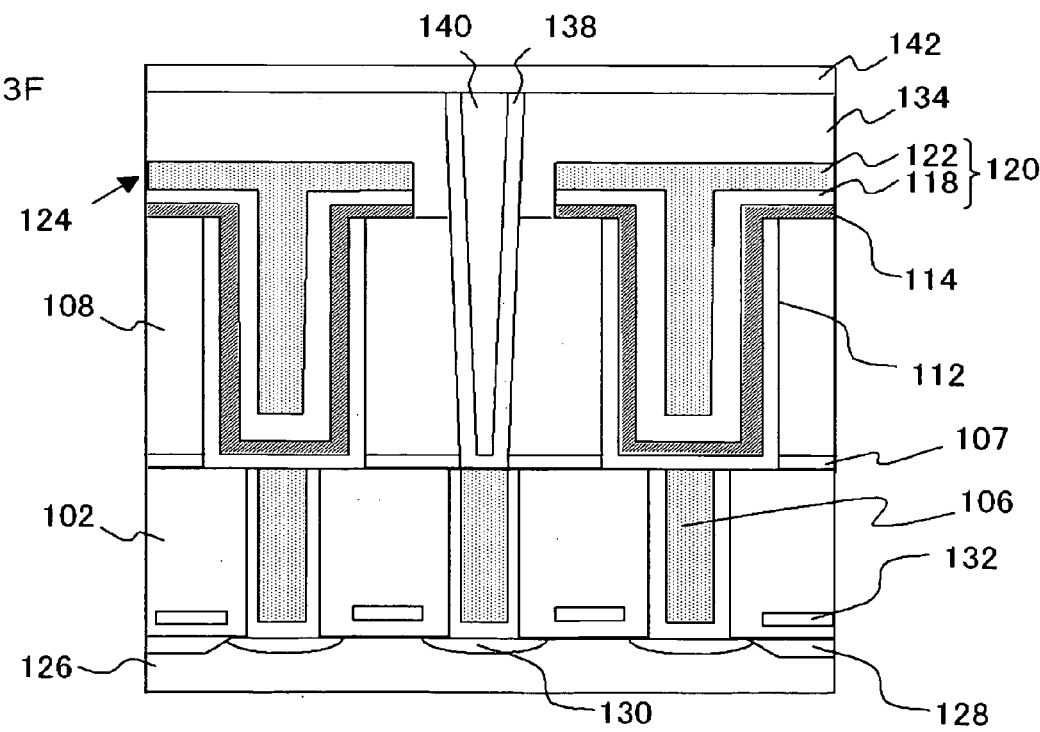

Thereafter, as shown in FIG. 11A, the upper electrode 120 is processed into a certain pattern. Then, an interlayer insulating film 134 is formed on the upper electrode 120 (FIG. 11B). Subsequently an opening 136 is formed between adjacent capacitors 124 (FIG. 12C). Thereafter, the barrier metal film 138 and the metallic film 140 are formed in the opening 136 (FIG. 12D). In this case, the barrier metal film 138 may be composed of, for example, a TiN film formed via CVD or PVD. Further, the metallic film 140 may be, for example, W film formed via CVD. Then, the barrier metal film 138 and the metallic film 140, which are exposed outside of the opening 136, are removed via CMP (FIG. 13E). Subsequently, the interconnect layer 142 is formed on the interlayer insulating film 134 (FIG. 13F). The interconnect layer 142 may be, for example, composed of TiN and W. The interconnect layer 142 is patterned into a certain geometry to form bit lines. The semiconductor device 100 having the configuration shown in FIG. 1 is formed by such process. Thereafter, an interlayer insulating film (not shown) composed of a silicon oxide film, for example, may be formed on the interconnect layer 142, and a multiple-layered interconnect structure may be formed thereon.

Figure 4:
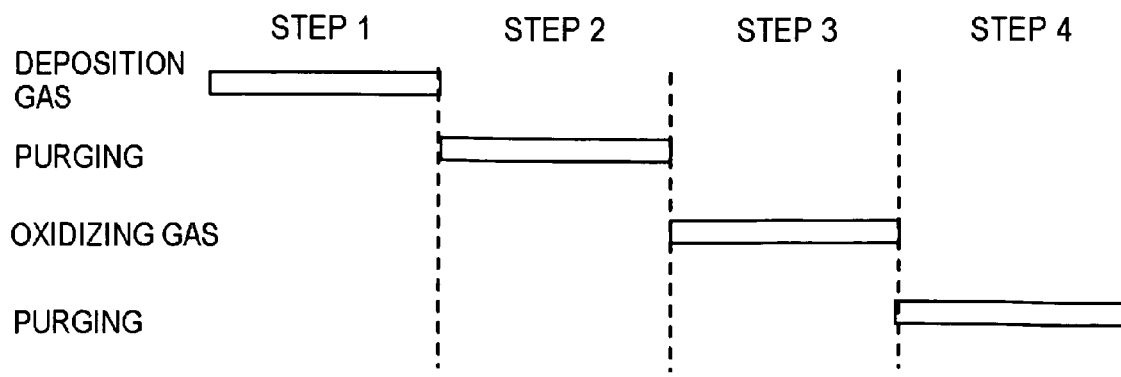
FIG. 4 is a timing chart, illustrating timings for supplying the gas in the case of depositing the capacitor dielectric film via an ALD process.

Next, the manufacturing process for depositing the capacitor dielectric film 114 will be described in detail. FIG. 4 is a timing chart, illustrating timings for supplying the gas in the case of depositing the capacitor dielectric film 114 via ALD process. As for ALD process, a deposition chamber is utilized. The ALD process includes a process cycle of: introducing a deposition gas (step 1); purging (step 2); introducing an oxidizing gas (step 3); and purging (step 4), and the steps 1 to 4 are repeated to form the capacitor dielectric film 114. A film having a thickness of several angstroms is deposited by conducting a stage of introducing the source material of step 1 through step 3, and therefore the above-described cycles are repeated until a desired thickness of the deposited film is achieved.

In the present embodiment, the organic source material containing one or more metallic element(s) selected from the group consisting of Zr, Hf, La and Y is employed as the deposition gas. Such organic source material may be a material containing carbon (C) and nitrogen (N), such as a material presented by a general formula: $M(NRR')_4$ (where R and R' are $C_xH_y$, and M is a metallic element selected from the group consisting of Zr, Hf, La and Y).

For example, when the capacitor dielectric film 114 is composed of a $ZrO_2$ film, $Zr(N(Me)Et)_4$ (tetraethyl methylamino zirconium, TEMAZ) or $Zr(NEt_2)_4$ (tetra diethylamino zirconium, TDEAZ) may be employed for the deposition gas (where Me indicates methyl group, and Et indicates ethyl group). Further, when the capacitor dielectric film 114 is composed of, for example, $HfO_2$ film, $Hf(N(Me)Et)_4$ (tetraethyl methylamino hafnium, TEMAH) or $Hf(NEt_2)_4$ (tetra diethylamino hafnium, TDEAH) may be employed. For the oxidizing gas, $O_2$, $N_2O$, NO or $O_3$ gas or a gaseous mixture thereof may be employed, for example.

Figure 5:
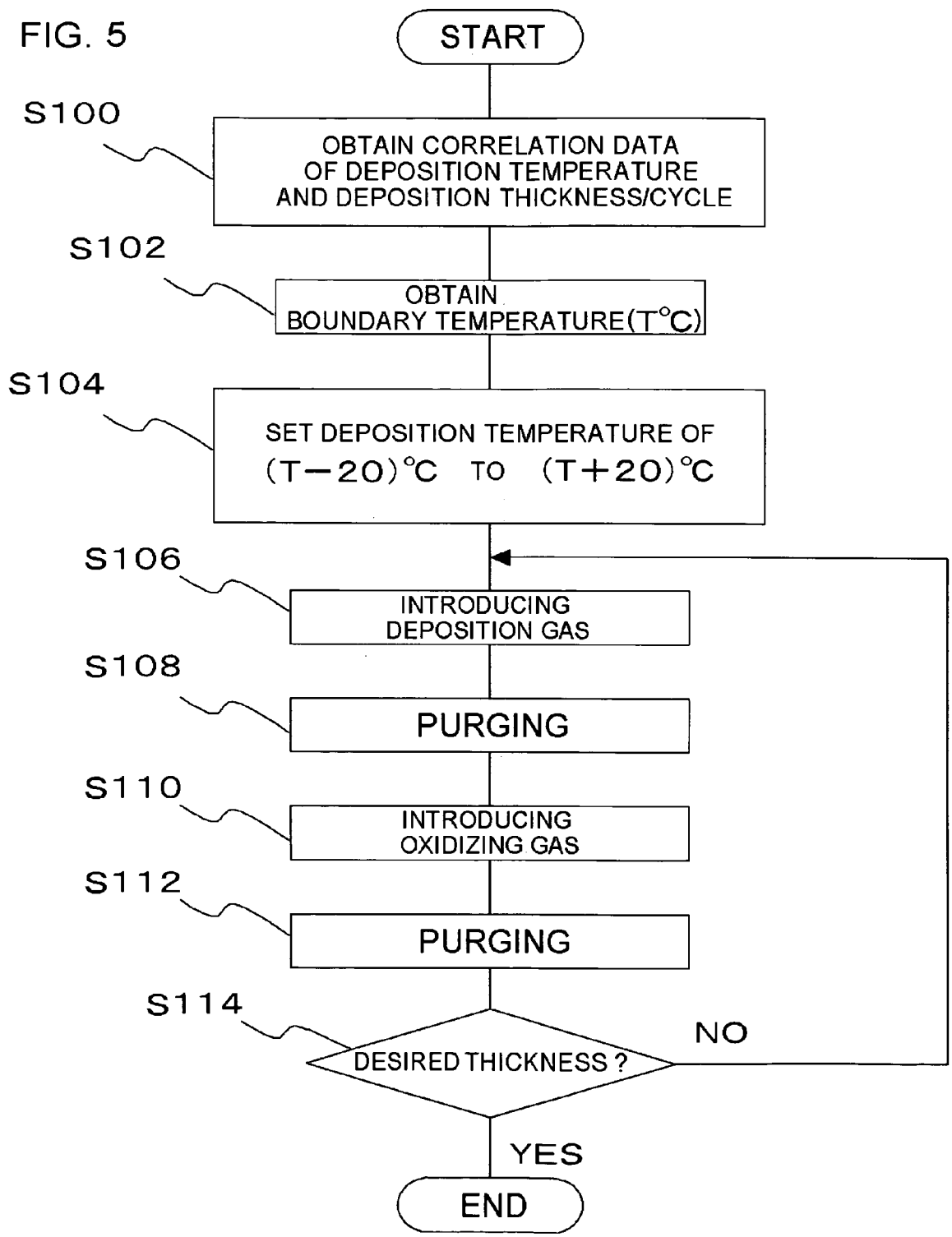
FIG. 5 is a flow chart, showing the process for depositing the capacitor dielectric film in the embodiment.

FIG. 5 is a flow chart, showing the process for depositing the capacitor dielectric film 114 in the present embodiment. First, a correlation data of deposition temperature and the deposition thickness of the capacitor dielectric film 114 deposited in every deposition cycle at the deposition temperature (i.e., deposition rate) in the case of forming the capacitor dielectric film 114 via ALD are obtained (S100).

Subsequently, a boundary temperature T (degree C.), at which an increase in a deposition rate in every cycle is detected, is obtained on the basis of the obtained correlation data (S102).

Figure 6:
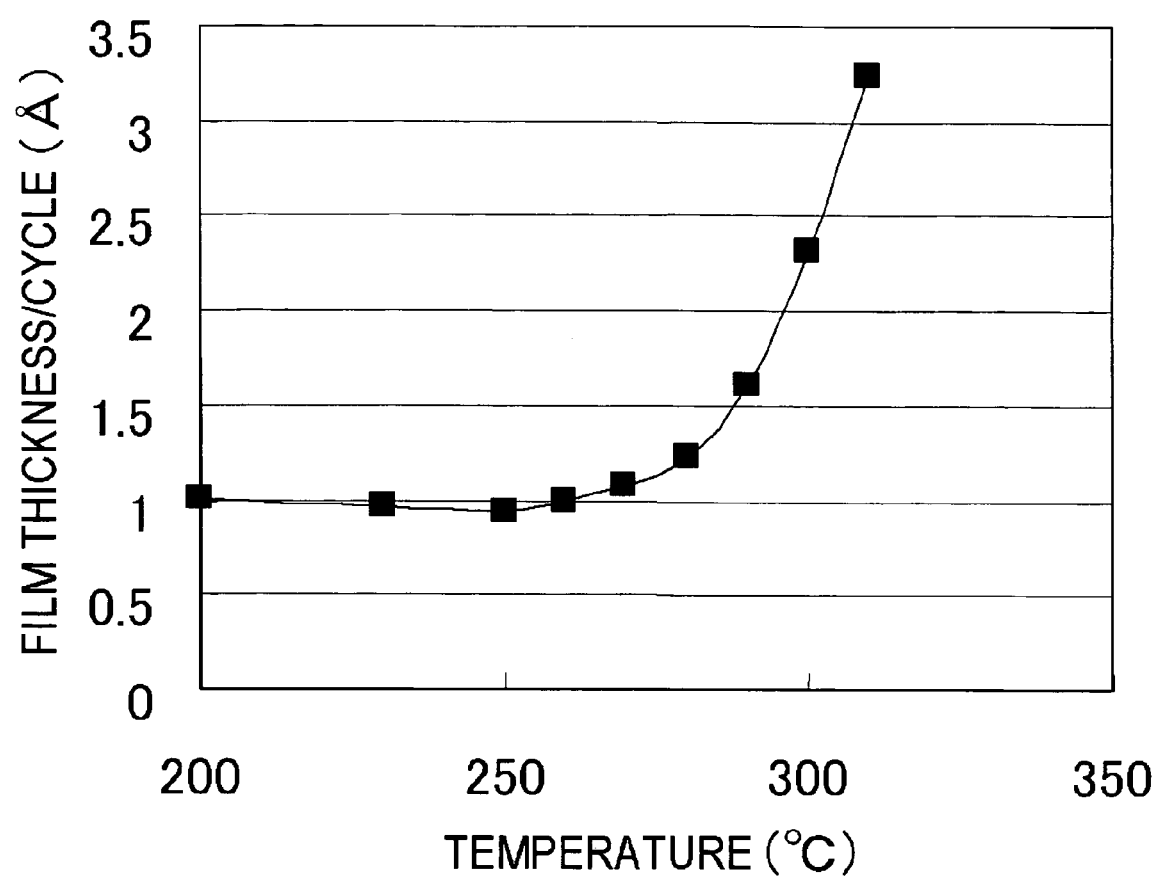
FIG. 6 is a graph, showing correlation data between the deposition temperature and the thickness of the deposited film in every cycle in the case of depositing the capacitor dielectric film via an ALD process.

FIG. 6 is a graph, showing correlation data between the deposition temperature and the thickness of the deposited film in every cycle in the case of depositing the capacitor dielectric film 114 via an ALD process employing a deposition gas of Zr(N(Me)Et)4 (tetraethyl methylamino zirconium, TEMAZ) and an oxidizing gas of $O_3$ gas. In this graph, the thickness of the deposited film is slightly decreased as the temperature is increased, at a temperature within a range of from about 200 degree C. to about 250 degree C., and the increase in the thickness of the deposited film as increasing the temperature is shown at a temperature around 250 degree C. In this case, the boundary temperature T=250 degree C.

Returning back to FIG. 5, the deposition temperature is set to be within a range of from (T−20) degree C. to (T+20) degree C., by taking the boundary temperature T obtained in step S102 as a reference (S104).

Subsequently, under such temperature condition, introducing the deposition gas (S106), purging (S108), introducing the oxidizing gas (S110) and purging (S112) are sequentially conducted. One cycle of the ALD process is carried out by such sequential process steps. Thereafter, a desired film thickness of the capacitor dielectric film 114 has been acquired or not is judged (S114), and if it is not, the cycle of the process from step S106 to step S112 is repeated until the desired thickness is obtained. When the desired thickness of the capacitor dielectric film 114 is achieved ("YES" in S114), the process for depositing the capacitor dielectric film 114 is completed.

The boundary temperature may be various based on a deposition machine, the maximum of the boundary temperature difference may be about 40 (degree C.), even if a capacitor dielectric film ($ZrO_2$ for example) is deposited with a same deposition condition using a same type of deposition machine. This boundary temperature difference may happen by using a different vendor machine with which different parts are employed, by inherent unevenness of a heater used in the machine or the like. Therefore, getting the appropriate boundary temperature "T" (degree C.) and depositing the capacitor dielectric film at (T−20) to (T+20) (degree C.), as described above, makes it possible to manufacture a semiconductor device stably without depending on a deposition machine.

EXAMPLES

Examples will be described as follows.

Example 1

The capacitor dielectric film 114 composed of $ZrO_2$ film was deposited by a method similar to that stated above to form the capacitor 124. $Zr(N(Me)Et)_4$ (tetraethyl methylamino zirconium, TEMAZ) was employed for the deposition gas for depositing the capacitor dielectric film 114. $O_3$ gas was employed for the oxidizing gas.

The correlation data between the deposition temperature and the thickness of the deposited film in every cycle in this case is shown in FIG. 6. In such case, the boundary temperature T (degree C.), at which an increase in a deposition rate in every cycle is shown, was 250 degree C.

Figures 7, 8:
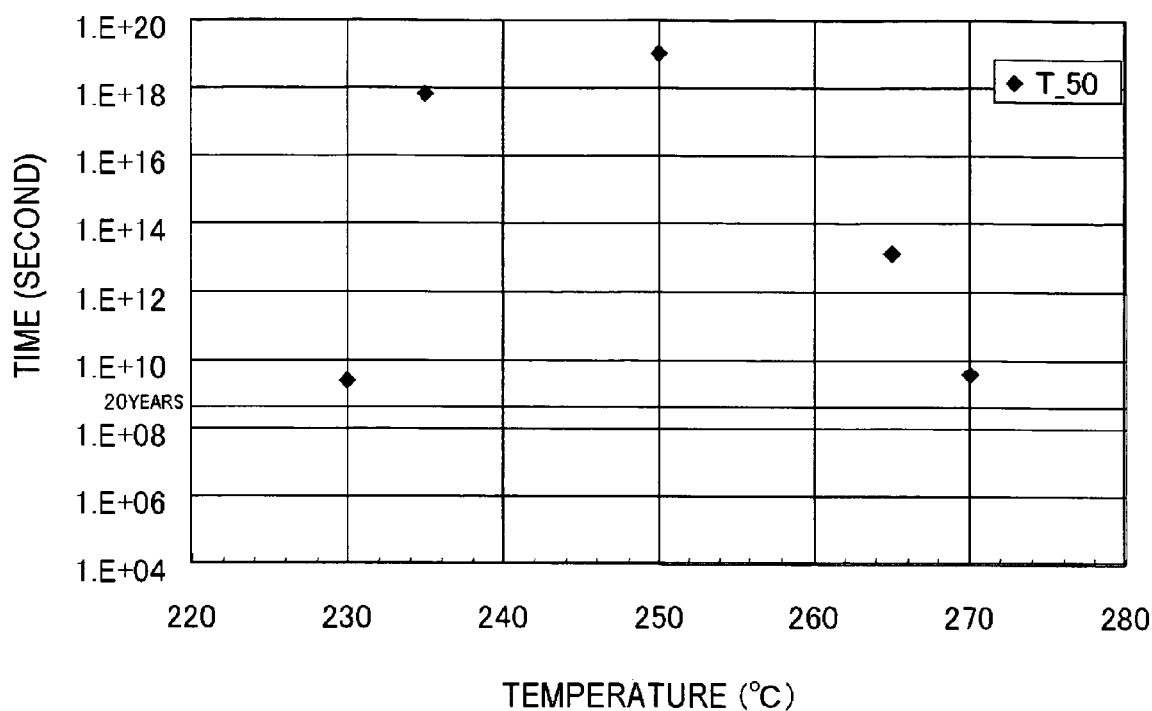
FIG. 7 is a graph, showing results of reliability tests for the formed capacitors.
FIG. 8 is a table, showing the leakage currents value of the capacitors.

FIG. 7 is a graph, showing results of a reliability test (time dependent dielectric breakdown, TDDB) of a capacitor 124 in the case that the thickness of the capacitor dielectric film 114 is 90 angstroms. The abscissa is assigned to a deposition temperature in depositing the capacitor 124, and the ordinate is assigned to a time required for breaking down more than half of 57 capacitors when a constant electrical voltage (+0.6 V) is continuously applied to the 57 capacitors. In this case, the deposition temperature was within a range of from (boundary temperature T (250 degree C.)−20 degree C.) to (boundary temperature T (250 degree C.)+20 degree C.), i.e., 230 degree C. to 270 degree C. The time required for breaking down more than half of 57 capacitors was longest when the deposition temperature was 250 degree C., which is at the boundary temperature, and the time was reduced as deviating from 250 degree C. In the case of the device manufactured by depositing the capacitor dielectric film 114 at a temperature within a range of +/−20 degree C. of the boundary temperature, time required for breaking down more than half the capacitors was not shorter than 20 years, and thus it is indicative of presenting longer durability of such device, as compared with the device manufactured by depositing the capacitor dielectric film 114 at a temperature outside of the above-described temperature range.

In addition, the results of measuring a leakage current in the capacitors 124 having the capacitor dielectric films 114 that were deposited at deposition temperatures of 250 degree C. and 270 degree C., respectively, are shown in FIG. 8. In such case, when the deposition was carried out at the boundary temperature of 250 degree C., lower leakage current of $1 \times 10^{-16}$ (A/cell) was observed, and when the deposition was carried out at 270 degree C., which is the boundary temperature of 250 degree C. plus 20 degree C., lower leakage current of $5 \times 10^{-16}$ (A/cell) was also observed, and therefore it was concluded that the leakage current was within a specification current ($5 \times 10^{-16}$ (A/cell)) that is a criteria for an acceptance inspection in the performance of the capacitor 124.

When the deposition temperature is higher than a temperature within a certain temperature range in the deposition of the capacitor dielectric film 114 via ALD, the deposition gas is decomposed simultaneously with the adsorption thereof, and thus C and N are remained on the surface of the film without being bound to the metal. C and N remained as forms of the decomposed products are not purged in the step of purging, and all of these remained elements are not oxidized in the step of introducing the oxidizing gas, and thus are still remained in the film. As such, it is considered that the decomposed products contained within the deposited film may cause defects within the film, and the defects may be sources for the deterioration of the capacitor dielectric film, thereby reducing the reliability of the capacitor dielectric film. The decomposition of the deposition gas are considerably occurred at a temperature that is higher than the boundary temperature by 20 degree C. or more, when an organic source material containing C and N is employed as the deposition gas. In this case, the deposited film is contaminated with the decomposed products such as C or N as impurities. Therefore, it is considered that the reliability of the device including the capacitor dielectric film 114, which is deposited at a deposition temperature higher than the certain temperature range, is reduced.

On the other hand, it is considered that, when the deposition temperature is lower than the certain temperature range, the purging efficiency within the chamber is reduced, and therefore the deposition gas of the source material is remained within the chamber and the deposited film is contaminated with the remaining source material with a quantity beyond the appropriate quantity, thereby reducing the reliability of the device. In particular, when the organic source material employing C and N is used as the deposition gas, impurities such as C or N are mixed within the deposited film to reduce the reliability of the device.

Example 2

The capacitor dielectric film 114 composed of $HfO_2$ film was deposited by a method similar to that stated above to form the capacitor 124. $Hf(N(Me)Et)_4$ (tetraethyl methylamino hafnium, TEMAH) was employed for the deposition gas. $O_3$ gas was employed for the oxidizing gas.

Figures 9, 10:
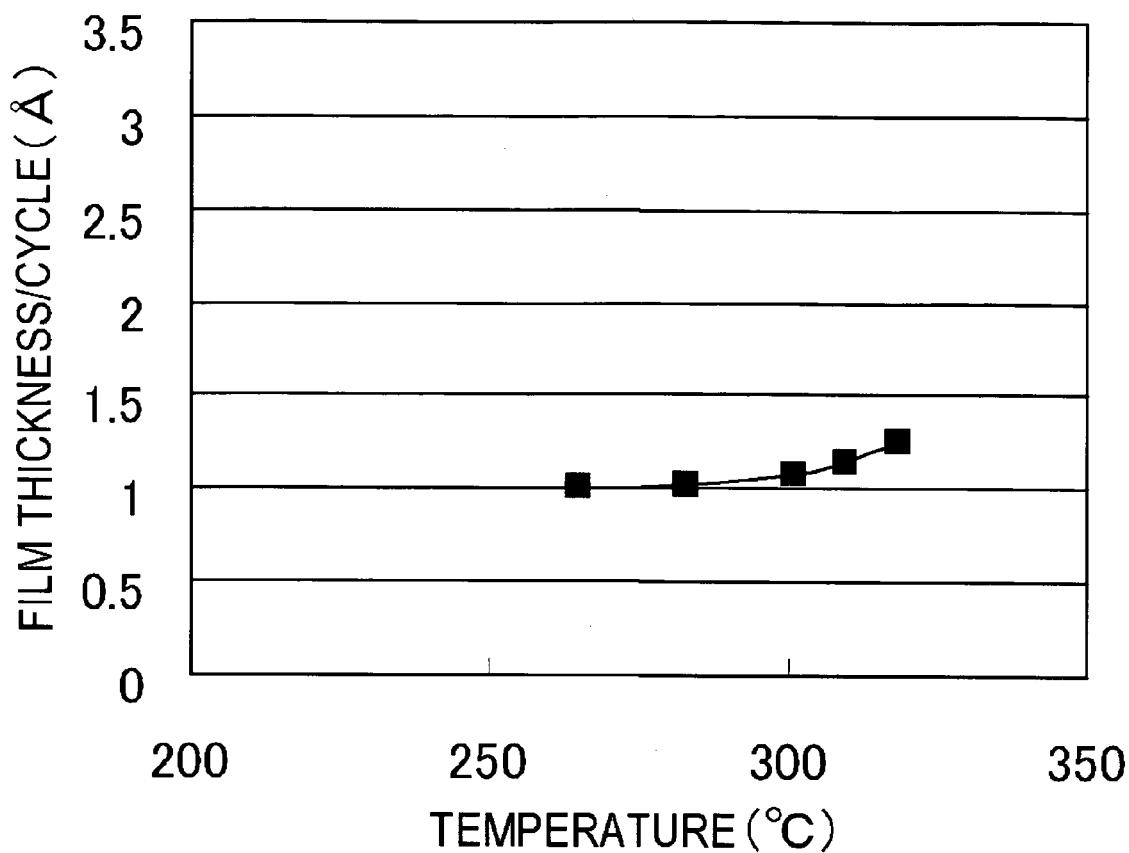
FIG. 9 is a graph, showing the correlation data between the deposition temperature and the thickness of the deposited film in every cycle in the case of depositing the capacitor dielectric film via an ALD process.
FIG. 10 is a table, showing the leakage currents value of the capacitors.

FIG. 9 is a graph, showing the correlation data between the deposition temperature and the thickness of the deposited film in every cycle in the present example. In such case, the boundary temperature T (degree C.), at which an increase in a deposition rate in every cycle is shown, was 280 degree C.

The results of measuring the leakage current of the capacitors 124 including the capacitor dielectric films 14 deposited at the deposition temperatures of 280 degree C. and 310 degree C., respectively, are shown in FIG. 10. In such case, while lower leakage current of $1 \times 10^{-16}$ (A/cell) was observed when the deposition was carried out at the boundary temperature of 280 degree C., when the deposition was carried out at 310 degree C., which is the boundary temperature of 280 degree C. plus 30 degree C., higher leakage current of $1 \times 10^{-15}$ (A/cell) was observed, and therefore it was concluded that the leakage current exceeded the specification current ($5 \times 10^{-16}$ (A/cell)). According to these results, it is considered that the deposition temperature of 310 degree C. would not present better results for the reliability test (TDDB).

As described above, the deposition temperature for depositing the capacitor dielectric film 114 via ALD can be optimized according to the present invention, and therefore the capacitor having longer durability and higher reliability can be manufactured.

While the capacitor under bit-line (CUB) having a capacitor formed under a bit line is illustrated in the above described embodiment, the present invention may also be applicable to a structure of capacitor over bit-line (COB) having a capacitor formed over the bit line.

While the preferred embodiments and examples of the present invention have been described above in reference to the annexed figures, it should be understood that the disclosures above are presented for the purpose of illustrating the present invention, and various configurations other than the above described configurations can also be adopted.

What is claimed is:

1. A method for manufacturing a semiconductor device including a capacitor by depositing a capacitor dielectric film of said capacitor via an atomic layer deposition employing an organic source material containing one or more metallic element(s) selected from the group consisting of Zr, Hf, La and Y as a deposition gas, comprising:
    obtaining a boundary temperature T (degree C.), at which an increase in a deposition rate for depositing said capacitor dielectric film is detected with increase in a deposition temperature, on the basis of a correlation data of the deposition temperature in the atomic layer deposition employing said deposition gas with a deposition rate for depositing said capacitor dielectric film at the deposition temperature; and
    depositing said capacitor dielectric film via the atomic layer deposition employing said deposition gas at a temperature within a range of from (T −20) (degree C.) to (T +20) (degree C.),
    wherein the deposition temperature is 250° C.±40° C.

2. The method for manufacturing a semiconductor device according to claim 1, wherein said organic source material contains C and N.

3. The method for manufacturing a semiconductor device according to claim 1, wherein said organic source material contains a material presented by a general formula: M(NRR')4
(where R and R' are CxHy and M is a metallic element selected from the group consisting of Zr, Hf, La and Y).

4. The method for manufacturing a semiconductor device according to claim 1, wherein said capacitor contains a lower electrode composed of a metallic material, and in said depositing said capacitor dielectric film, said capacitor dielectric film is formed on said lower electrode.

5. The method for manufacturing a semiconductor device according to claim 1, wherein said depositing said capacitor dielectric film includes depositing said capacitor dielectric film by repeating a combination of introducing said deposition gas and introducing an oxidizing gas.

6. A method for manufacturing a semiconductor device including a capacitor by depositing a capacitor dielectric film of said capacitor via an atomic layer deposition employing an organic source material containing one or more metallic element(s) selected from the group consisting of Zr, Hf, La and Y as a deposition gas, comprising:

obtaining a boundary temperature T (degree C.), at which an increase in a film thickness of said capacitor dielectric film formed in every cycle of the atomic layer deposition is detected with an increase in a deposition temperature, on the basis of a correlation data of the deposition temperature in the atomic layer deposition employing said deposition gas with a film thickness of said capacitor dielectric film formed in every cycle of the atomic layer deposition at the deposition temperature; and depositing said capacitor dielectric film via the atomic layer deposition employing said deposition gas at a temperature within a range of from (T−20) (degree C.) to (T+20) (degree C.), wherein the deposition temperature is 250° C.±40° C.

7. The method for manufacturing a semiconductor device according to claim 6, wherein said organic source material contains C and N.

8. The method for manufacturing a semiconductor device according to claim 6, wherein said organic source material contains a material presented by a general formula: M(NRR')4
(where R and R' are $C_xH_y$ and M is a metallic element selected from the group consisting of Zr, Hf, La and Y).

9. The method for manufacturing a semiconductor device according to claim 6, wherein said capacitor contains a lower electrode composed of a metallic material, and in said depositing said capacitor dielectric film, said capacitor dielectric film is formed on said lower electrode.

10. The method for manufacturing a semiconductor device according to claim 6, wherein said depositing said capacitor dielectric film includes depositing said capacitor dielectric film by repeating a combination of introducing said deposition gas and introducing an oxidizing gas.

* * * * *